United States Patent [19]

Fox

[11] Patent Number: 4,975,644
[45] Date of Patent: Dec. 4, 1990

[54] COIL SYSTEM FOR A MAGNETIC RESONANCE IMAGING SYSTEM

[75] Inventor: Timothy R. Fox, Chicago, Ill.
[73] Assignee: Kabushiki Kaisha Toshiba, Kawasaki, Japan
[21] Appl. No.: 330,309
[22] Filed: Mar. 29, 1989
[51] Int. Cl.⁵ .......................................... G01R 33/20
[52] U.S. Cl. ..................................... 324/318; 324/322
[58] Field of Search ............... 324/300, 307, 309, 312, 324/311, 318, 322; 128/653

[56] References Cited

U.S. PATENT DOCUMENTS

| | | | |
|---|---|---|---|
| 3,932,805 | 1/1976 | Abe et al. | 324/309 |
| 4,297,637 | 10/1981 | Crooks | 324/309 |
| 4,649,348 | 3/1987 | Flugan | 324/318 |
| 4,717,881 | 1/1988 | Flugan | 324/322 |
| 4,783,641 | 11/1988 | Hayes | 324/318 |
| 4,839,595 | 6/1989 | Boskamp | 324/318 |

OTHER PUBLICATIONS

Mitsuaki Arakawa, "Switchable Field-of-View Surface Coil", Univ. of Ca., San Francisco, Diasonics Inc., (1987), p. 823.
Requardt et al., "Fast Switched Array Coils", (1988), p. 843.
Boskamp, "A New Revolution in Surface Coil Tech", (1987), p. 405.
Roemer, "Simultaneous Multiple Surface Coil NMR Imaging", General Electric (1988), p. 875.

Primary Examiner—Michael J. Tokar
Attorney, Agent, or Firm—Finnegan, Henderson, Farabow, Garrett and Dunner

[57] ABSTRACT

A coil system for a magnetic resonance imaging (MRI) system includes a plurality of adjacent surface coils for sensing magnetization in a patient. Switches are provided for enabling selected ones of the plurality of coils to output electrical signals. A signal combiner combines the electrical signals from the selected coils into an output signal for further processing. Coupling cancellation networks are provided between adjacent ones of the plurality of coils for cancelling electrical coupling existing therebetween.

9 Claims, 9 Drawing Sheets

COIL SYSTEM FOR A MAGNETIC RESONANCE IMAGING SYSTEM

BACKGROUND OF THE INVENTION

The present invention relates to a coil system for a magnetic resonance imaging (MRI) system. An example of such an MRI system is the Toshiba MRT-50A NMR scanner. In such device, a patient is placed upon a table which includes a plurality of linearly arranged surface coils. A transmit coil induces a high power R.F. magnetic field in the patient during a "transmit" mode, which causes precessing magnetization in the patient. The surface coils detect this magnetization during a "receive" mode and output electric signals which may be processed by a computer associated with the MRI system.

Surface coil arrangements are used in MRI systems because they are advantageous in imaging anatomical regions close to the body's surface. For example, a very small coil near an eye can give a much better signal/noise ratio output signal than a larger coil which surrounds the entire head. In general, small coils are sensitive to signals from shallow depths in the patient over an area limited by the area of the coil. Thus, if an extended region or a deep region of the patient is to be imaged, a larger coil is necessary, which results in increased background noise levels.

A compromise between the volume of sensitivity of a coil and the resultant noise level in the output signal is ordinarily selected by an operator who selects appropriate coils from an arsenal of different coils, according to the region to be imaged. The coils are then installed in the MRI system before the patient is scanned. For example, a specific region of interest for surface coil imaging is the human spine. An operator may wish to image a long sagittal plane through the center of the spinal column to locate a suspected problem. Once the problem has been located, the operator may wish to image a transaxial slice through that location to analyze the problem. The long sagittal scan requires a long rectangular coil, but the small transaxial scan requires a much smaller square or circular coil. This is particularly disadvantageous in that the patient, who is lying supine upon the coils, must be moved while the coils are changed, which is time consuming (expensive), uncomfortable for the patient (who probably has back problems), and may result in an inaccurate relocation of the scan region.

One solution is to provide a ladder-shaped coil array in which an operator switches "rungs" of the ladder-shaped array to determine the overall rectangular size of the coil as necessary. Such an arrangement has limitations in that the effective position of the coil is difficult to change because the portion of the ladder which includes the connection terminals must be part of the selected rectangle. Alternatively, two different coils may be disposed in the same location. This technique is an unacceptable compromise because it results in parasitic coupling between the coils, which degrades the electrical performance of the coils.

Some devices which include a plurality of coils have reduced coupling therebetween by partially overlapping the coils to make the mutual inductance zero. Such overlapping coils are difficult to fabricate, however, and may give an inappropriate total response pattern. Further, this arrangement adequately reduces the coupling only between adjacent coils while mutual inductance may still exist between alternate coils in the array. As an alternative approach, the effect of coupling may be reduced using feedback techniques to "damp" the effective Q of tuned circuits used in the coil configuration. This, of course, complicates the tuning of the coil and any related amplifier designs.

SUMMARY OF THE INVENTION

In view of the foregoing disadvantages of conventional coil systems, an object of the present invention is to provide a coil system for an MRI system which allows selection of a plurality of surface coils used to image a predetermined region of the patient, and provides an efficient means for cancelling electrical coupling between the surface coils of the system.

To achieve these and other objects, and in accordance with the purpose of the invention as embodied and broadly discussed herein, the present invention provides a coil system, for a magnetic resonance imaging system, for imaging a selective pattern on an object, comprising a plurality of adjacent surface coils for sensing a predetermined condition produced in the object and for outputting electrical signals corresponding thereto; means for enabling selected ones of the plurality of coils to output the electrical signals based on the selected pattern; means for combining the electrical signals from the enabled ones of the plurality of coils to provide an output signal; and means for cancelling electrical coupling between adjacent ones of the plurality of coils.

BRIEF DESCRIPTION OF THE DRAWINGS

The accompanying drawings, which are incorporated in and constitute a part of the specification, illustrate a preferrred embodiment of the invention and, together with the description, serve to explain the principles of the invention. The objects and features of the present invention will become apparent from the description of the preferred embodiment taken in conjunction with the accompanying drawings wherein.

DESCRIPTION OF THE PREFERRED EMBODIMENT

Figure 1:
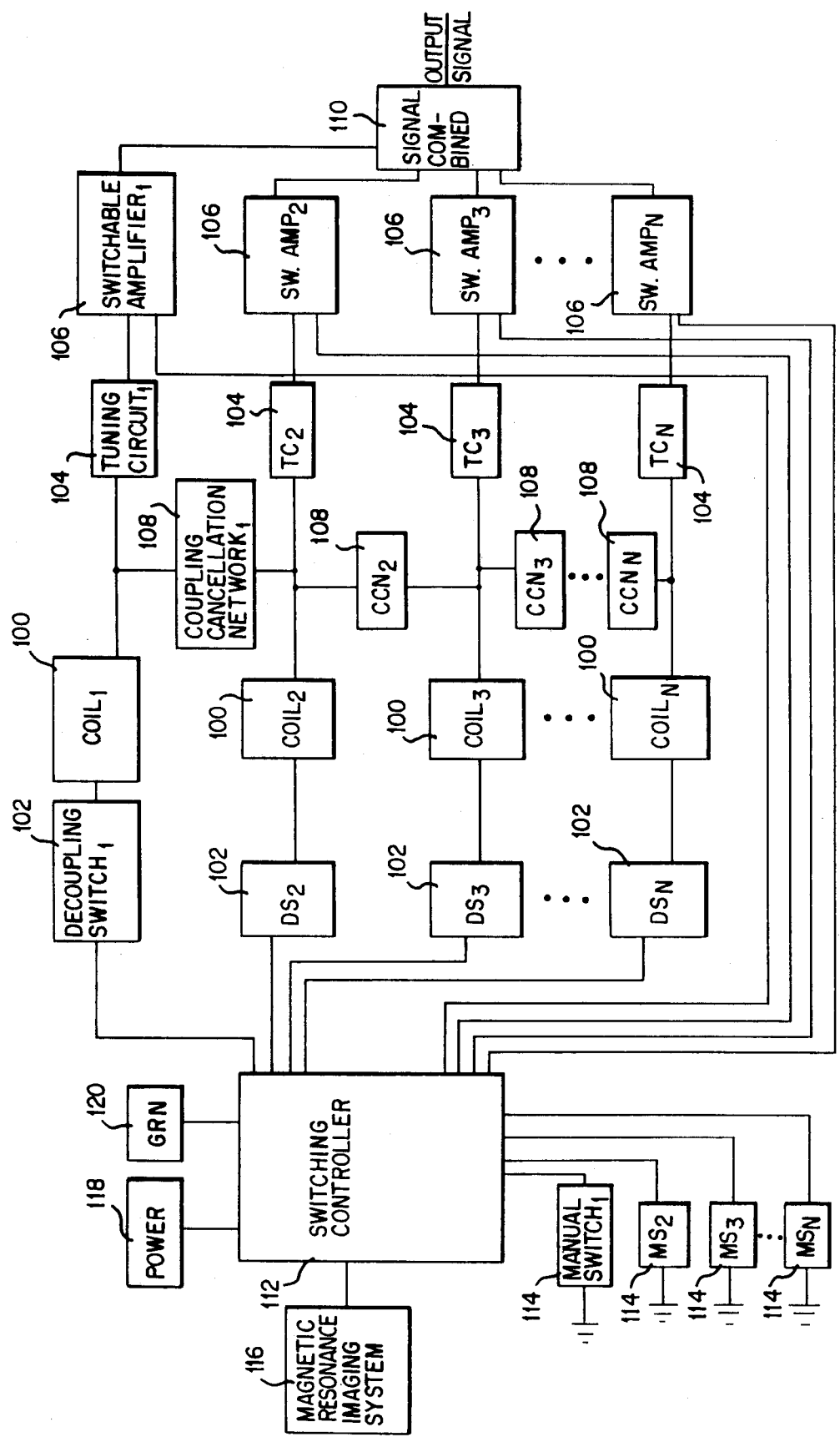
FIG. 1 is a block diagram of a coil system for an MRI system according to the preferred embodiment of the invention.

As shown in FIG. 1, an MRI coil system according to a preferred embodiment of the present invention includes a plurality of coils 100, a plurality of decoupling switches 102, a plurality of tuning circuits 104, a plurality of switchable amplifiers 106, a plurality of coupling cancellation networks 108, a signal combiner 110, a switching controller 112 and manual switches 114. The coil system of the preferred embodiment is directly associated with an MRI system 116 which includes a processing unit (not shown) for outputting enabling signals to the switching controller 112. The coils 100 are connected to the switching controller 112 by respective decoupling switches 102. Tuning circuits 104 are connected at the output of coils 100, and the coupling cancellation networks 108 are connected between adjacent coils 100. Tuning circuits 104 output signals to the switchable amplifiers 106, which also receive outputs from the switching controller 112. The switchable amplifiers 106 output signals to the signal combiner 110. Manual switches 114 are connected to the switching controller 112 which, as described above, receives enabling signals from the MRI system 116. Switching controller 112 is also connected to a power source 118 and a ground source 120, and couples these sources to the system components as necessary, in accordance with conventional techniques.

In operation, a system operator designates selected ones of the coils 100 necessary to image a selected portion of a patient, using the appropriate manual switches 114. For example, if the operator desires to image only a small portion of the patient's spine using a coil arrangement having five coils, the operator may select only coils 1 and 2 using manual switches 1 and 2. The manual switch selection is routed through the switching controller 112, which enables the selected coils 100 through the respective decoupling switches 102, as described more fully below. Additionally, the switch controller 112 routes a selection signal from the selected manual switches 14 to the corresponding switchable amplifiers 106 (for this example, switchable amplifiers 1 and 2). In this manner, a channel is opened for the selected coils 100 to output electrical signals to the signal combiner 110.

When the transmitter coil (not shown) of MRI system 116 transmits R.F. energy to initiate magnatization in the patient, coils 100, although selected by manual switch 114, are decoupled from the MRI system 116 by operation of the decoupling switch 102, described more fully below. Once the MRI system 116 has transmitted the necessary R.F. energy to the patient, the processor therein outputs a digital receive enable signal to the switching controller 112. Only when the switching controller 112 has received both the selection signals from the manual switches 114 and the receive enable signal from the MRI system 116, does it transmit the signal to the appropriate decoupling switches 102 to activate the corresponding coils 100.

Signal combiner 110 combines the electrical signals from the coils 100, as output by the corresponding switchable amplifiers 106, to provide an output signal which may be further processed by the MRI system 116 to provide information about the patient. This data may ultimately be displayed on a display device (not shown).

Tuning circuits 104 tune each of the respective coils 100 to an operating frequency. This operating frequency may be, for example, 21.3 MHz, which is the frequency of the R.F. energy transmitted to the patient by the transmit coil of the MRI system 116.

The coupling cancellation networks 108 are disposed between adjacent coils 100 to cancel any electrical coupling existing therebetween.

In accordance with one embodiment of the invention, means are provided for enabling selected ones of the plurality of coils to output electrical signals based on a selected pattern. As shown in FIG. 1, by way of example and not limitation, the enabling means comprise switching controller 112 and manual switches 114. In accordance with one embodiment of the invention, the enabling means includes first switch means for selecting the selected ones of the plurality of coils, second switch means, responsive to an output from the first switch means and an enable signal from the MRI system for enabling the selected ones of the plurality of coils to sense a predetermined condition and to output electrical signals; and third switch means responsive to an output from the first switch means for enabling an amplifying means to output only electrical signals corresponding to the selected coils.

Figure 3:
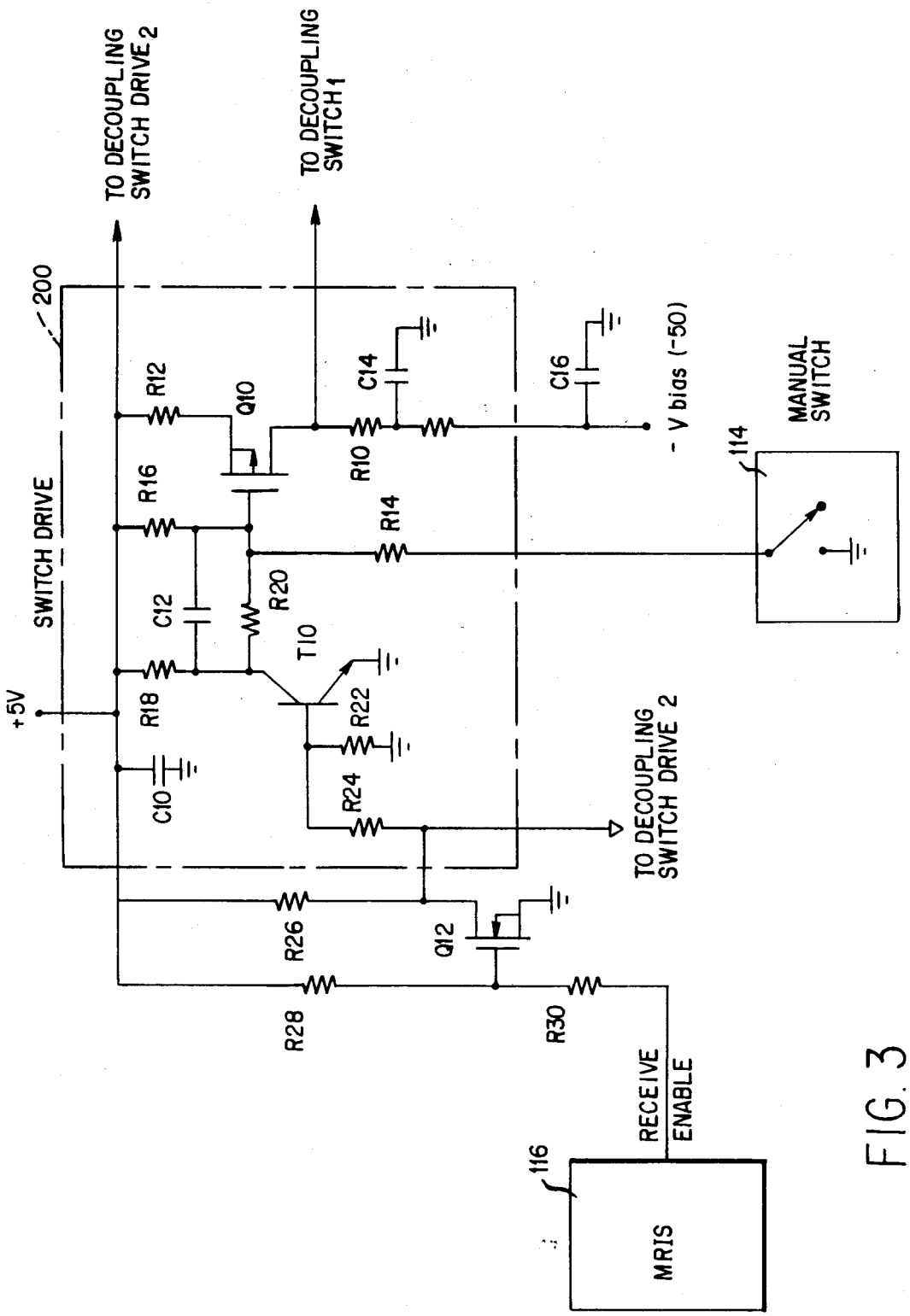
FIG. 3 is a circuit diagram of a switch drive shown in FIG. 2.

As shown in FIG. 3, by way of example and not limitation, switching controller 112 includes a plurality of switch drives 200 and amplifier switches 202, corresponding to the number of coils 100. Switch drives 200 receive an output signal from a respective manual switch 114 as well as a receive enable signal from the MRI system 116 and output control signals to respective decoupling switches 102. Amplifier switches 202 receive an output from a respective manual switch 114 and output a control signal to a corresponding switchable amplifier 106.

Each of the switch drives 200 includes resistors R10, R12, R14, R16, R18, R20, R22 and R24; capacitors C10, C12, and C14; and transistor T10 and FET Q10, connected as shown in the drawing. Resistors R24, R26 and R28, and FET Q12 are common to each of the switch drives and may be contained, for example, in the switching controller 112.

As stated above, each switch drive provides an output to its corresponding decoupling switch to couple and decouple the corresponding coil based on a receive enable signal from the MRI system 116 and a selection signal from its corresponding manual switch 114. FET Q12 acts as a digital receiver and logical inverter for the receive enable signal output by the MRI system 116. When the receive enable signal is high (receive mode), a low voltage goes to transistor T10. If the manual switch 114 has not been selected, it is in the open position as shown in FIG. 3. In this open position, the low voltage at the base of transistor T10 turns it OFF and puts a high voltage at the gate of FET Q10 to turn it OFF. When FET Q10 is OFF, resistor R10 pulls the output to the decoupling switch down to the negative supply bias, which may be, for example, approximately -50 volts. This negative voltage, applied to the decoupling switch couples the coil and establishes the selected coil in the "receive mode."

When the transmit coil of the MRI system 116 is transmitting R.F. energy to the patient, the receive enable signal is not transmitted to the switch drive circuit. As a result, the base of FET Q10 is high and the gate of FET Q10 is low which turns FET Q10 ON. This switches the output to the decoupling switch to the positive supply bias (+5 V) through resistor R12 and FET Q10, which turns the decoupling switch ON so as to decouple the associated coil from the MRI system 116 during the "transmit" mode.

If it is desired to continuously disable or decouple a particular coil, the corresponding manual switch 114 can be closed (moved to the ground position), which grounds resistor R14 and holds the gate of transistor T10 low. As long as this gate remains low, the decoupling switch remains ON to decouple the associated coil. Resistors R16, R18, R20, R22 and R24 serve to bias their corresponding transistor. Likewise, resistors R26, R28 and R30 serve to bias transistor FET Q12. Capacitor C12 is provided to speed up the charge transfer from T10 to FET Q10, and capacitors C10, C114 and C16 are, for example, conventional by-pass capacitors.

Figure 2:
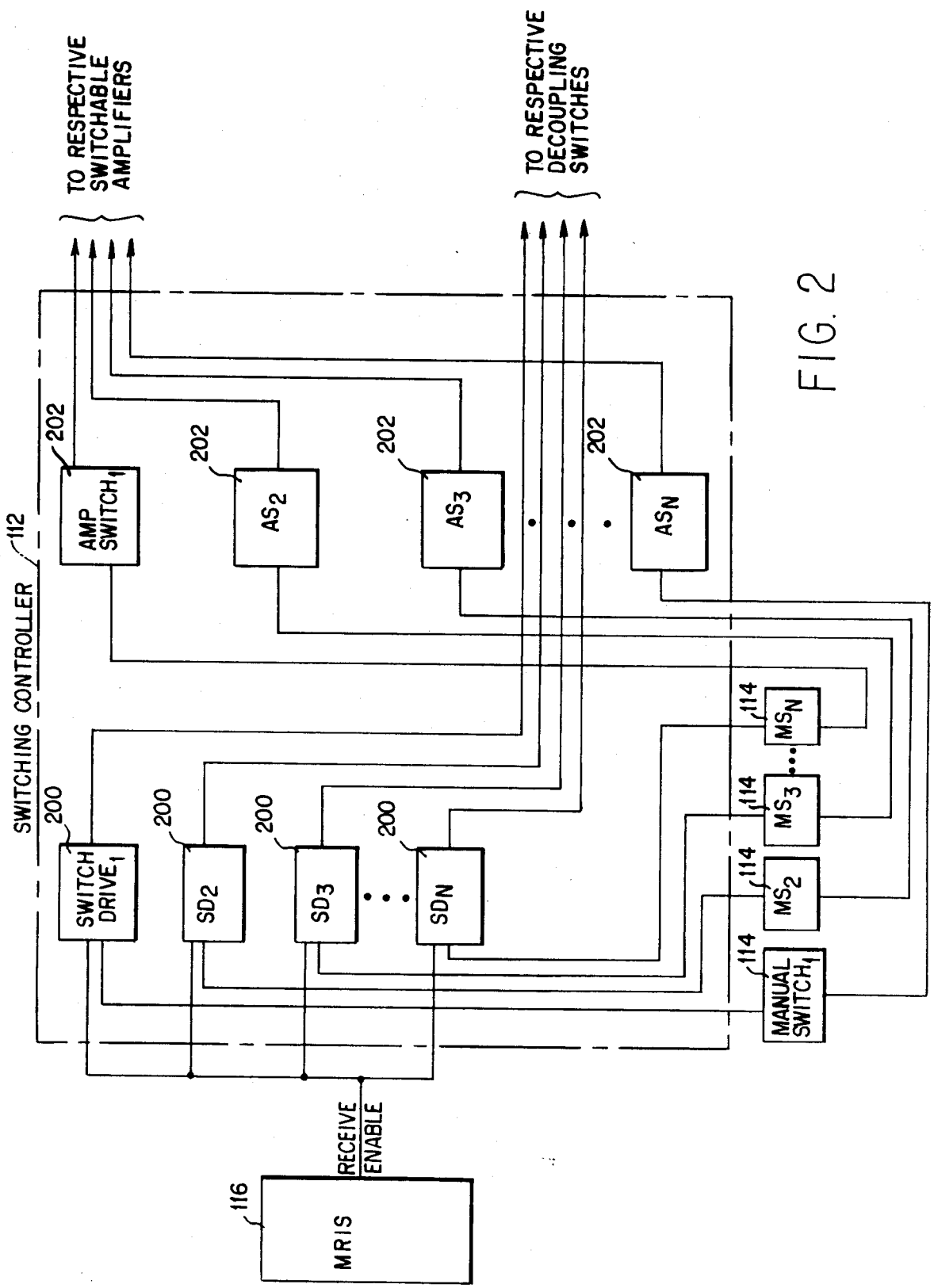
FIG. 2 is a block diagram of the switching controller shown in FIG. 1.
Figure 4:
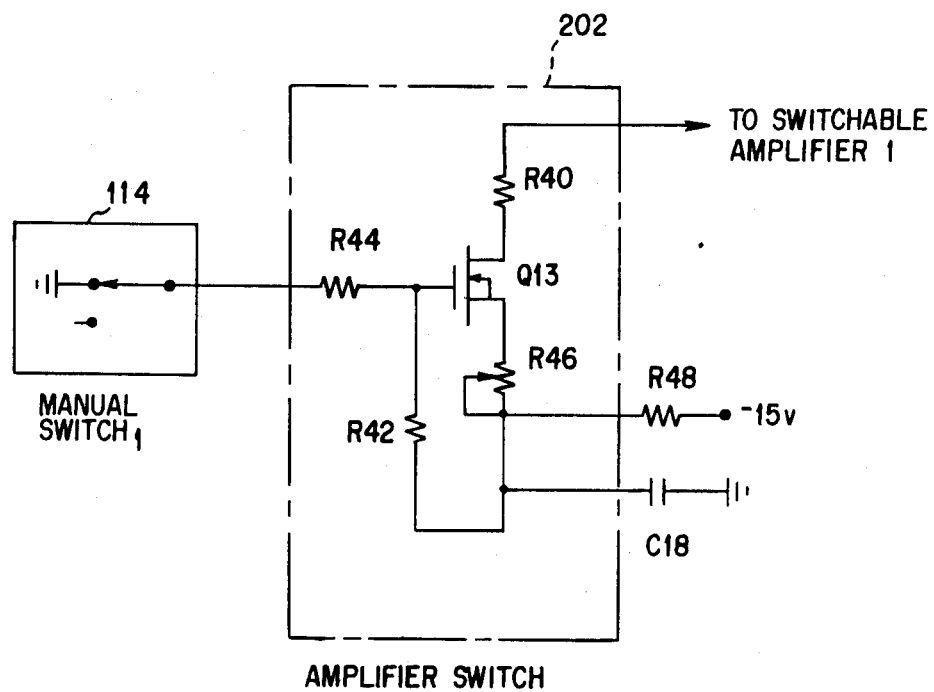
FIG. 4 is a circuit diagram of an amplifier switch shown in FIG. 2.

FIG. 4 is a circuit diagram of an amplifier switch 202 included in the switching controller 112 of FIG. 2. Each of amplifier switches 202 includes FET Q13 and resistors R40, R42, R44 and variable resistor R46, connected as shown in the drawing. When the manual switch 114 is open, FET Q13 is OFF and there is zero voltage from the gate of FET Q13 to the −15 volt supply. When the manual switch 114 is grounded, FET Q13 is turned ON, enabling current from the −15 volt supply to flow to the switchable amplifier through resistors R48, R46 and R40. Resistors R42 and R44 provide biasing for FET Q13. Resistor R46 is shown as a variable resistor which can be used to change the bias current in the FET Q13 to change the gain of the related channel. Capacitor C18 is a conventional by-pass capacitor.

It should be noted that the amplifier switches 202 are turned ON when the manual switch 114 corresponding thereto is grounded, while the switch drives 200 are turned on when the manual switch 114 corresponding thereto are open circuited. Such an operation can be accomplished using conventional switching techniques. For example, a single-pole, double-throw switch or a double-pole, double-throw switch, configured in accordance with the operation of these devices, may be used to provide this switching.

As shown in FIGS. 1 and 2, the switching controller 112 includes the switch drives 200 and the amplifiers switches 202 for making the necessary connections to the decoupling switches 102 and the switchable amplifiers 106, respectively. In an alternative arrangement, the switch drives 200 and the amplifier switches 202 may be incorporated directly into the decoupling switches 102 and the switchable amplifiers 106, respectively.

Figure 5:
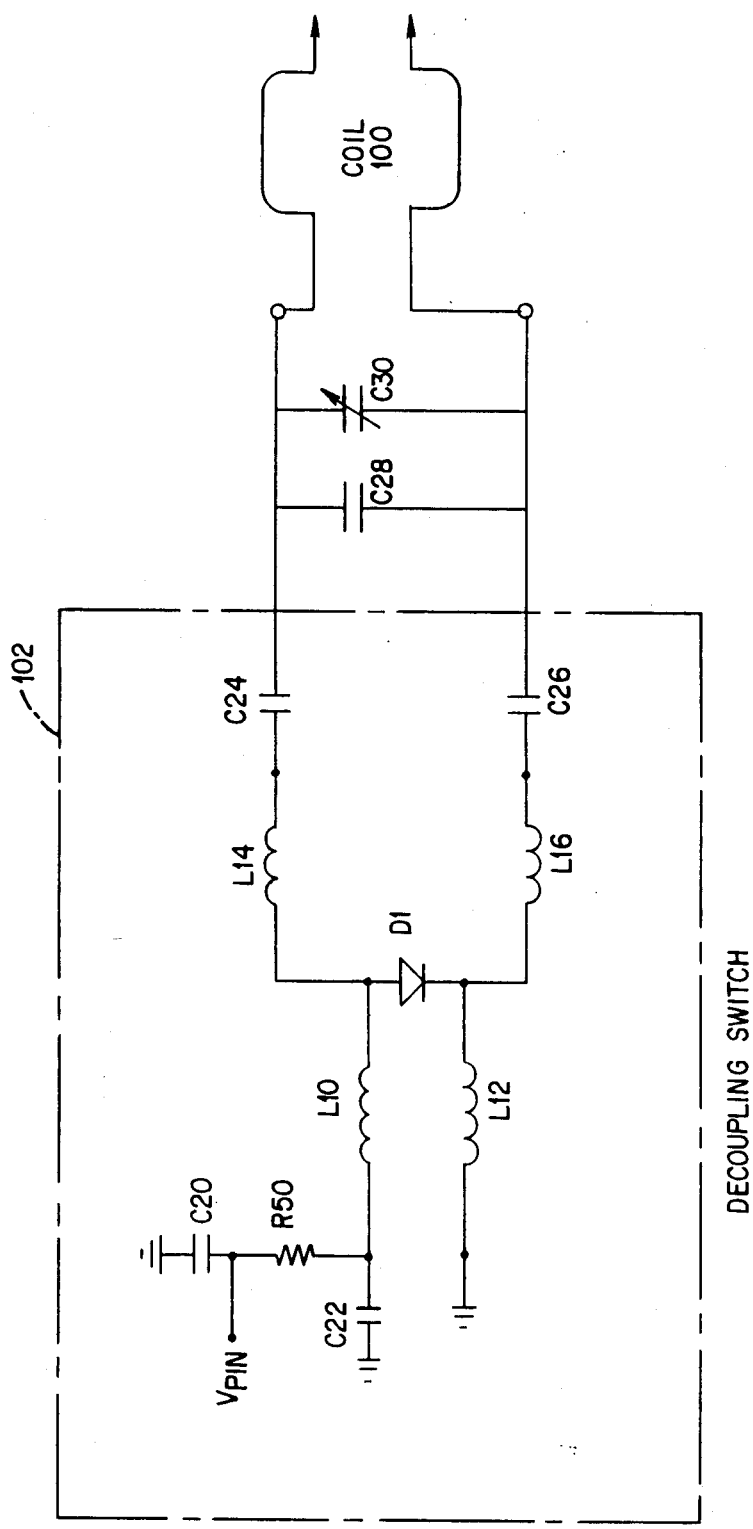
FIG. 5 is a circuit diagram of a decoupling switch shown in FIG. 1.

FIG. 5 shows a circuit diagram of a decoupling switch 102. Each decoupling switch includes a PIN diode D1, resistor R50, capacitors C20, C22, C24 and C26, and coils L10, L12, L14 and L16, connected as shown in the figure. This configuration comprises a "resonant trap decoupling switch" and has two operating states: diode ON and diode OFF. To turn the PIN diode D1 ON, +5 volts is applied to $V_{pin}$ from the corresponding switch drive and a direct current flows through resistor R50, R.F. choke coil L10, PIN diode D1, and R.F. choke coil L12 to ground. With this direct current flowing through it, PIN diode D1 will show very low (e.g., less than one ohm) resistance to high-frequency (e.g., 21.3 MHz) alternating current. To turn diode D1 OFF, −50 volts is applied to $V_{pin}$ from the corresponding switch drive. This voltage will reverse bias PIN diode D1, which acts as a small capacitor (less than one pF) and provides a high impedance to the high-frequency (21.3 MHz) alternating current.

With PIN diode D1 OFF, the circuit C24, L14, L16 and C26 is essentially disconnected from the "to coil" terminals leaving a capacitance (C28+C30) thereacross. This capacitance is included in the total circuit that resonates the surface coil at 21.3 MHz for receiving; hence, the diode OFF state is used when the coil 100 is in the receiving mode. Capacitors C24, and C26 isolate the high DC voltage from the coil and from the tuning network at the other side of the coil. Large capacitors may be used to minimize the effect of these capacitors on the small inductors L14 and L16.

When PIN diode D1 is ON, the circuit C30, C28, C24, C26, L14 and L16 forms a parallel resonant circuit, which makes the total impedance at the "to coil" connections very high at the resonant frequency (21.3 MHz). This "open circuits" the coil, to decouple the transmit coil of the MRI system therefrom. Thus, the diode ON state is used when the MRI system's coil is transmitting. Capacitors C20 and C22 are bypass capacitors to reduce coupling to other circuits through the PIN diode drive connection. The two R.F. chokes L10 and L12 allow the DC diode bias to reach the PIN diode D1, but isolate the diode and the inductors L14 and L16 from ground at high frequencies.

Figure 6:
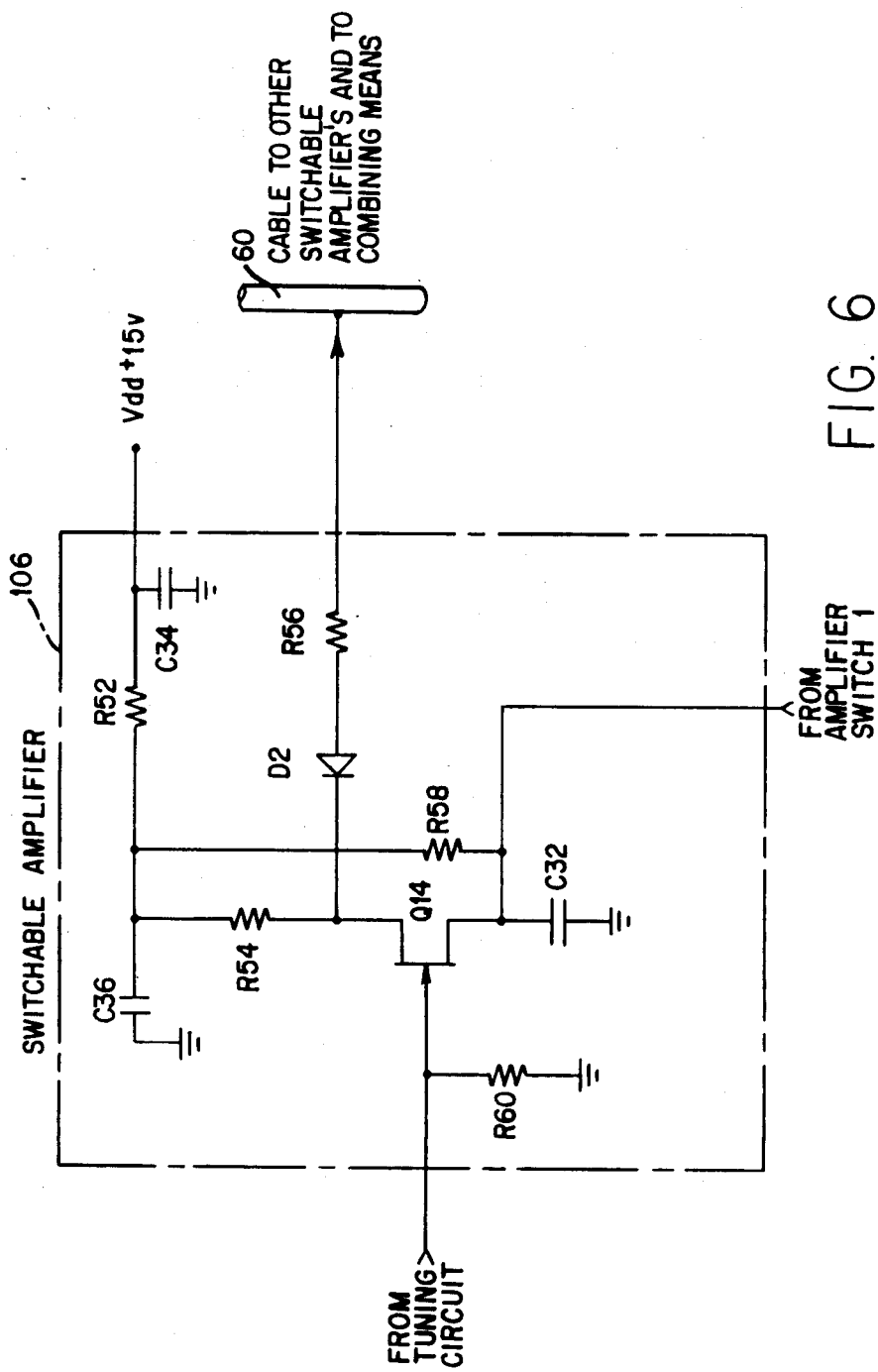
FIG. 6 is a circuit diagram of a switchable amplifier in FIG. 1.

In accordance with the preferred embodiment of the invention, means are provided for amplifying the electrical signals. As shown in FIG. 6, by way of example and not limitation, the amplifying means comprise switchable amplifier 106.

Each switchable amplifier 106 includes FET Q14, resistors R52, R54, R56, R58 and R60, capacitors C32, C34, and C36 and diode D2, connected as shown in the drawing. This circuit takes an AC voltage from the tuning circuit 104, amplifies it into an alternating current and outputs the alternating current to a cable connected to the outputs of all of the switchable amplifiers 106. FET Q14 is connected as a common source amplifier. The source terminal is by-passed to ground for high frequencies by capacitor C32. A DC bias is provided by grounding the base through resistor R60, supplying, e.g., 8 milliamps of current from a negative power supply (which is the output from the corresponding amplifier switch) and connecting the output to a low DC resistance node at about +5 volts (which exists at the cable 60 by connection to the combining circuit 110).

When a switchable amplifier 106 is selected by a corresponding manual switch 114, current is input to FET Q14. With this bias current, the drain current of FET Q14, flowing through the drain resistors R54 and R52, will cause the drain node to fall from +15 volts to +5 volts, such that the output diode D2 will conduct. Since the load impedance at the output is much smaller than resistor R54, almost all of the output alternating current flows into output cable 60, rather than drain resistor R54. Diode D2 may alternatively comprise a diode-connected transistor to provide a non-magnetic diode.

To disable the switchable amplifier 106, as described above, the input from the amplifier switch 202 is open-circuited. Thus, the resistor R58 will pull up the source node of FET Q14 to $V_{dd}$, so that the gate-source reverse bias cuts-off the FET Q14. The drain node will then be pulled up to $V_{dd}$, reverse biasing diode D2 and disconnecting FET Q14 from the cable 60. When the switchable amplifier 106 is disabled in this fashion, both the signal and noise at the FET Q14 output will be isolated from the cable. Output resistor R56 may be added to suppress any parasitic oscillation caused by the very-high-frequency characteristics of the output cable 60. By-pass capacitors C36, and C34 reduce coupling between the switchable amplifiers 106 through the $V_{dd}$ power supply line.

Figure 7:
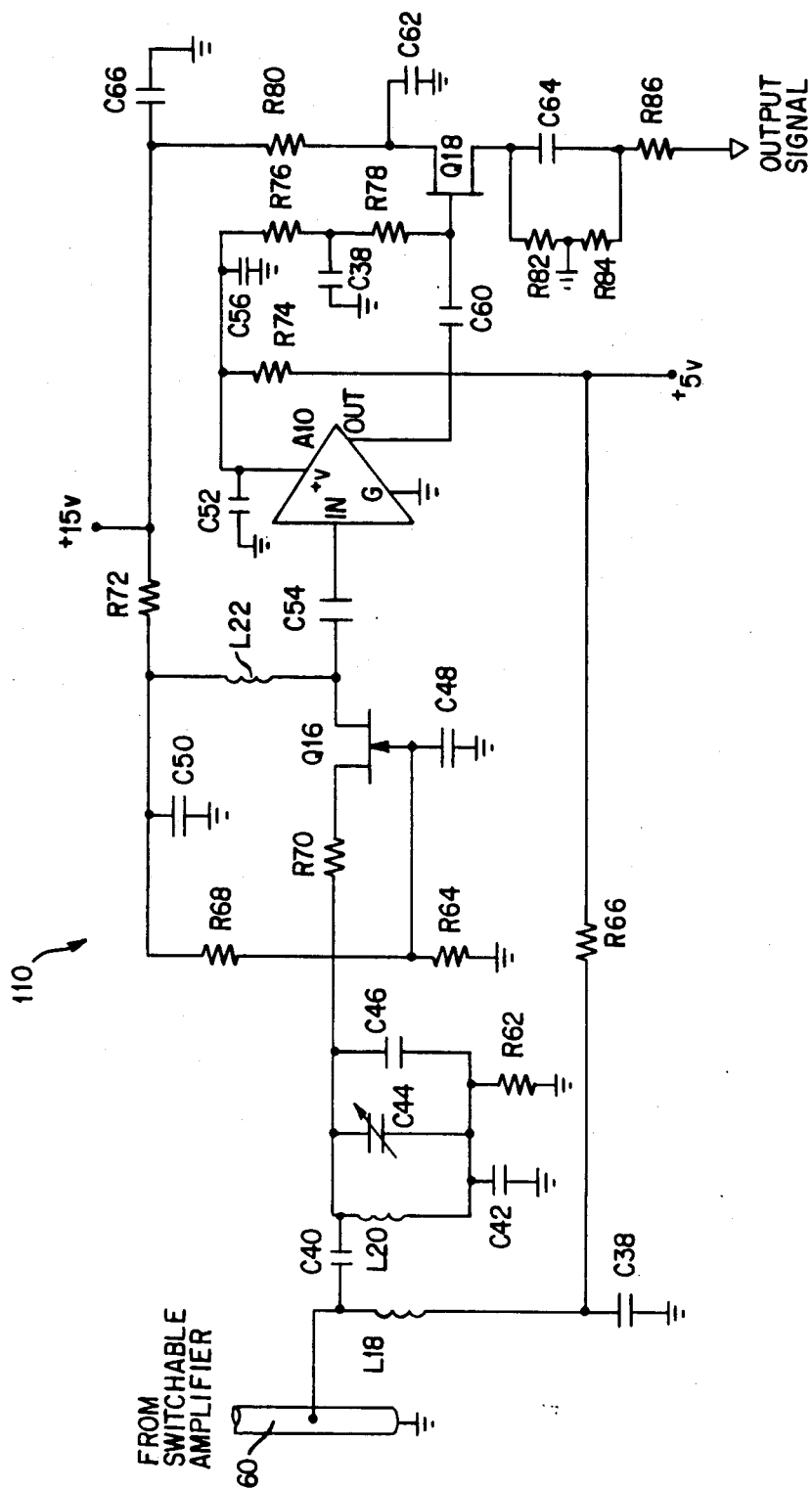
FIG. 7, is a circuit diagram of a signal combining device shown in FIG. 1.

In accordance with the preferred embodiment of the invention, means are provided for combining the electrical signals from the enabled ones of the plurality of coils to provide an output signal. As shown in FIG. 7, by way of example and not limitation, the combining means comprise the signal combiner 110 which includes transimpedance amplifier A10, inductors L18, L20, L22, FETs Q16 and Q18, resistors R62, R64, R66, R68, R70, R72, R74, R76, R78, R80, R82, R84, R86, and capacitors C38, C40, C42, C44, C46, C48, C50, C52, C54, C56, C58, C60, C62, C64, C66, arranged as shown in the drawing. The total output current from all of the enabled switchable amplifiers 106 flows through the output cable 60 to the signal combiner 110. The DC component flows through coil L18 to a +5 volt DC supply through resistor R66. The high-frequency AC component flows through capacitor C40 to inductor L20, and into the source node of FET Q16 which acts as a common gate amplifier. The source node provides a low input impedance for the input current which gives efficient summing for the output currents of the high-output-impedance switchable amplifiers 106. Transimpedance amplifier (current-in, voltage-out) A10 may comprise a suitable commercially available integrated circuit. For example, a SIGNETICS NE5212 may be selected for this purpose. Coupling circuit L18, L20 and C40 isolates the DC bias currents of the switchable amplifiers 106.

The DC bias current flows through R.F. choke L22 to the +15 volt supply and the high-frequency current flows through C54 to the input of transimpedance amplifier A10. Resistors R64 and R68 provide the proper bias voltage on the gate of FET Q16. The source bias current of FET Q16 flowing through resistor R64 provides the proper bias voltage on the source of FET Q16. The bias voltage on the drain of FET Q16 is essentially +15 volts. Capacitors C38, C42, C48, C50 are by-pass capacitors that maintain constant voltage (AC ground). Capacitors C44 and C46 are tuning capacitors. Resistor R70 increases the input impedance of FET Q16 to provide an approximate impedance match to the 50 ohm coaxial cable transmission line 60.

The remainder of the post-transimpedance amplifier circuit is a source follower buffer amplifer configuration. Capacitor C60 couples the output voltage from transimpedence amplifier A10 into FET Q18 and onto the 50 ohm output port. Resistors R60-R86 provide necessary biasing, capacitors C52, C56, C58, C62 and C66 are by-pass capacitors and capacitor C64 is a coupling capacitor.

Figure 8:
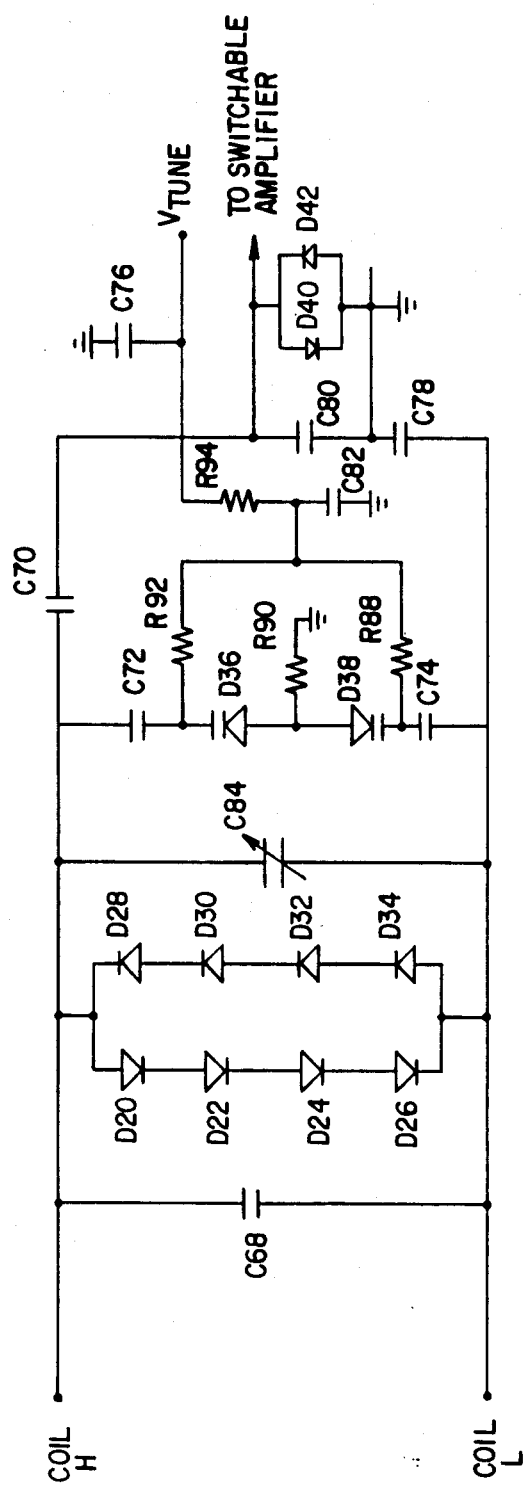
FIG. 8 is a circuit diagram of a tuning device shown in FIG. 1.

In accordance wi-th the preferred embodiment of the invention, means are provided for tuning each of the plurality of coils to an operating frequency. As shown in FIG. 8, by way of example and not limitation, the tuning means comprise tuning circuit 104 which includes capacitors C68, C70, C72, C74, C76, C78, C80, C82, diodes D20, D22, D24, D26, D28, D30, D32, D34, D36, D38, D40, D42, and resistors R88, R90, R92, and R94, arranged as shown in the drawing.

For the initial tuning of the coil array, a mid-range DC voltage (approximately +5 volts) is applied to the $V_{TUNE}$ terminal on every tuning circuit 104 simultaneously. With this constant voltage applied, each manual tuning capacitor C84 is adjusted to resonate its coil circuit at the operating frequency (e.g. 21.3 MHz) with the other coil circuits disabled. After this set-up procedure, tuning of the array is accomplished by having the MRI system processor adjust the DC voltage $V_{TUNE}$ applied to all tuning circuits 104 to obtain the maximum signal from the coil system, with the desired coil circuits enabled. Resistors R88, R90 and R92, apply the DC voltage to diodes C36 and C38, while providing a high impedance for the high-frequency AC voltage across the diodes. Since these diodes are reverse biased, only a very small DC current flows through the resistors R88, R90 and R92.

A bypass network of C76, R94 and C82, helps isolate the tuning diodes from any noise or interference in the $V_{TUNE}$ line. Capacitors C72 and C74 isolate the diode DC voltages from the rest of the circuit. Since these capacitors C72 and C74 are chosen to be approximately the same value as the capacitance of diodes D36 and D38, they reduce the effect of the diodes and the total capacitance variation; however, they also reduce the effect of the loss (equivalent parallel resistance) in the diodes on the total loss of the tuning capacitance.

Capacitors C70, C80 and C78, comprise the coupling network that couples the total coil voltage to the input of the corresponding switchable amplifier 106. This three capacitor network provides two functions. First, since the series combination of C70 and C80 is chosen to equal the value of C78, this balances the capacitance to ground from the H and L terminals of the coil. With a balanced capacitance, the voltages at H and L will also be balanced with respect to ground, which reduces the undesired capacitive coupling from the coil to the patient and reduces the capacitive coupling from one coil circuit to another. Second, this series capacitor circuit effects a transformer action on the circuit impedance, so that the impedance seen by the amplifier is lower than the total resonant impedance of the tuning circuit 104. This source impedance should be chosen to optimize the noise performance of the switchable amplifier 104.

The two diode networks including diodes D20, D22, D24, D26, D28, D30, D32, and D34; and diodes D40 and D42, do not conduct during the receiving mode, since the voltages across the individual diodes are too low to turn ON the diode junctions. During the transmit mode, the circuit voltages increase to a level that turns ON these diodes. The diode networks then limit the circuit voltages to safe levels that will not damage the other components. Alternatively, it may be possible to use base-collected diodes of "old fashioned" R.F. signal transistors that have higher resistances at zero bias than normal signal diodes or more modern transistors in order to have very high resistance diodes when OFF. Capacitor C68 is a tuning capacitor.

In accordance with the preferred embodiment of the invention, means are provided for cancelling electrical coupling between adjacent ones of the plurality of coils. As shown in FIG. 1, by way of example and not limitation, the cancellation means comprise coupling cancellation networks 108. Each coupling cancellation network 108 provides the equivalent of two equal capacitors, which are simultaneously adjustable, to cancel the electrical coupling that exists between the coils. Specific circuit configurations for the coupling cancellation networks 108 can vary and are disclosed in U.S. Pat. No. 4,769,605, which is commonly assigned, and which is hereby incorporated by reference. While the coupling cancellation networks described in U.S. Pat. No. 4,769,605 relate to quadrature antenna coil assemblies, the circuits therein are adaptable for use in surface coil configurations to which the present invention applies. However, since in the surface coil arrangement described herein, the coils are adjacent, rather than orthogonal as disclosed in U.S. Pat. No. 4,769,605, the component values of these circuits must be increased since coupling is much larger between adjacent coils.

Figure 9:
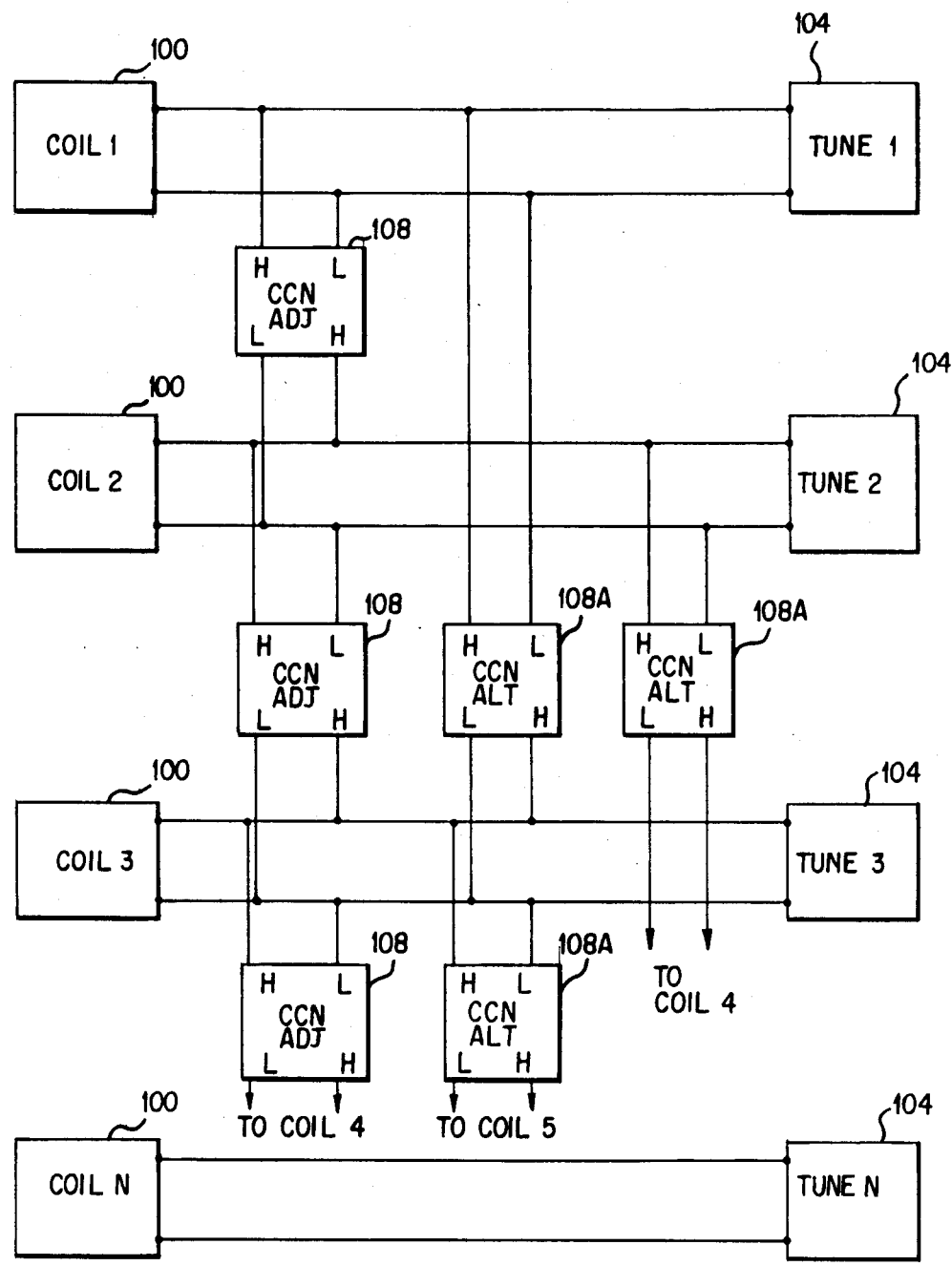
FIG. 9 is a block diagram of an alternative coupling cancellation network arrangement in accordance with another embodiment of the present invention.

In addition to providing coupling cancellation networks 108 between adjacent coils, as shown in FIG. 9, it may be desirable to include additional coupling cancellation networks 108A between alternate coils. For example, a coupling cancellation network 108A may be provided between coils 1 and 3, and/or 3 and 5 and/or between coils 2 and 4. Additional coupling cancellation networks can be provided between any of the coils as necessary.

Figure 10:
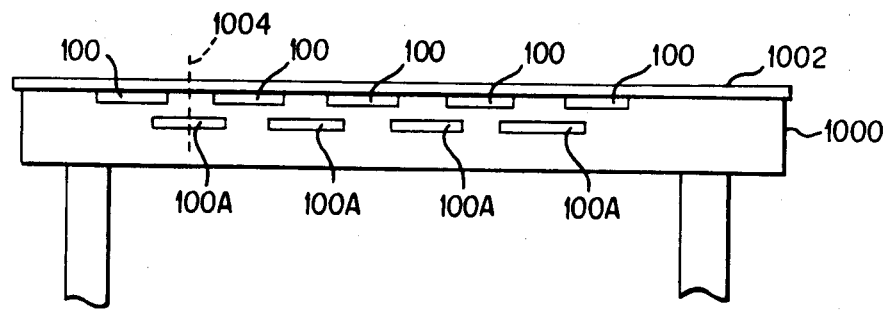
FIG. 10 is an alternative surface coil arrangement in accordance with another embodiment of the present invention.

FIG. 10 shows an alternative surface coil arrangement wherein a second layer of surface coils 100A is disposed below a first layer of surface coils 100. Table 1000 includes both layers of coils 100 and 100A and a pad 1002 upon which the patient lies. Each of surface coils 100A is identical to surface coils 100, and is connected and operated in all manners similarly to surface coils 100. Surface coils 100A are preferably located such that their center line 1004 is located directly between the two adjacent surface coils 100 directly above.

This additional layer of surface coils 100A provides for more accurate imaging of the patient. For example, if the patient has a problem with his or her spinal column which is located at a position falling between coils 100, an improved image can be obtained by selecting the appropriate surface coil 100A using a manual switch 114 (not shown in FIG. 10) associated therewith in a manner similar to that described above for selecting surface coils 100. Such additional layer of surface coils improves the signal/noise ratio of the generated signal.

While coupling cancellation networks 108 may be connected between surface coils 100A in a manner similar to that shown with respect to surface coils 100, such may not be necessary since, in operation, only one surface coil 100A is selected at any one time. However, if it were desired to have more than one surface coil 100A receiving at the same time, coupling cancellation networks 108 could be provided in a manner as described above. Generally, surface coils 100 should be turned OFF before turning ON one or more surface coils 100A so as to prevent coupling therebetween, which could degrade the signal output from the surface coils.

While the present invention has been described in terms of the preferred embodiment, it should be understood that numerous modifications may be made thereto without departing from the spirit and scope of the invention, and it is intended that the present invention covers the modifications and variations of the methods and devices provided herein which come within the scope of the appended claims and their equivalents.

What is claimed is:

1. A coil system, for a magnetic resonance imaging system, for imaging a selected pattern on an object, comprising:
    a plurality of adjacent surface coils for sensing a predetermined condition produced in said object and for outputting electrical signals corresponding thereto;
    means for enabling selected ones of said plurality of coils to output said electrical signals based on said selected pattern;
    means for combining said electrical signals from the enabled ones of said pluraltiy of coils to provide an output signal; and
    means for cancelling electrical coupling between adjacent ones of said plurality of coils.

2. A coil system according to claim 1, further comprising means for amplifying said electrical signals; wherein said enabling means includes first switch means for selecting said selected ones of said plurality of coils, and second switch means, responsive to an output from said first switch means and to a signal from said MRI system, for causing said selected ones of said plurality of coils to sense said predetermined condition and to output said electrical signals.

3. A coil system according to claim 2, wherein said enabling means further includes third switch means, responsive to said output from said first switch means, for causing said amplifying means to output only electrical signals corresponding to said selected coils.

4. A coil system according to claim 1, wherein said combining means comprises current summing means for adding together currents output by said selected ones of said plurality of coils.

5. A coil system according to claim 1, further comprising tuning means for tuning each of said plurality of coils to an operating frequency.

6. A coil system- according to claim 1, further comprising means for cancelling electrical coupling between alternate ones of said plurality of coils.

7. A coil system according to claim 1, wherein said enabling means includes means for decoupling said selected ones of said plurality of coils from a transmitting coil of said magnetic resonance imaging system when said magnetic resonance imaging system is in a transmitting mode, and for enabling said selected ones of said plurality of coils when said magnetic resonance imaging system is in a receive mode.

8. A coil system according to claim 1, further comprising an additional plurality of adjacent surface coils disposed in a plane parallel to said plurality of adjacent surface coils for sensing said predetermined condition produced in said object and for outputting electrical signals corresponding thereto.

9. A coil system according to claim 8, wherein each of said additional plurality of adjacent surface coils is disposed such that a center line thereof is between adjacent ones of said plurality of adjacent surface coils.

* * * * *